United States Patent [19]

Eckenbrecht

[11] 4,025,951
[45] May 24, 1977

[54] VERTICAL SYNCHRONIZING CIRCUIT HAVING ADJUSTABLE SYNC PULSE WINDOW

[75] Inventor: Robert R. Eckenbrecht, East Bethany, N.Y.

[73] Assignee: GTE Sylvania Incorporated, Stamford, Conn.

[22] Filed: June 9, 1976

[21] Appl. No.: 694,238

[52] U.S. Cl. .............................................. 358/158
[51] Int. Cl.² ....................................... H04N 5/05
[58] Field of Search .......... 358/158, 149, 148, 154, 358/153, 264, 266; 331/20; 178/69.1

[56] References Cited

UNITED STATES PATENTS

| | | | |
|---|---|---|---|
| 3,688,037 | 8/1972 | Ipri | 358/158 |
| 3,899,635 | 8/1975 | Steckler et al. | 358/158 |
| 3,916,102 | 10/1975 | Merrell | 358/158 |

*Primary Examiner*—John C. Martin
*Attorney, Agent, or Firm*—Norman J. O'Malley; Robert E. Walrath; Robert T. Orner

[57] ABSTRACT

A vertical synchronizing circuit wherein a counter counts pulses at twice the horizontal deflection rate and provides a vertical output pulse at a predetermined count is shown. A synchronism or mode detector causes the circuit to switch to a driven mode when the counter is not reset in synchronism with the vertical synchronizing pulses. The mode detector causes the circuit to switch to a countdown mode when synchronism is detected. A phase detector detects phase errors between the counter and the vertical synchronizing pulses when the circuit is in the countdown mode and causes the counter to delete or add counts depending upon the direction of the phase error when such phase errors persist for a predetermined number of vertical fields. The vertical synchronizing pulses are applied to a gate which is enabled in the countdown mode when the counter reaches a predetermined count shortly before a vertical synchronizing pulse is anticipated. An auxiliary counter counts pulses and is reset by each vertical output pulse. In the driven mode the synchronizing pulse gate is enabled at a predetermined earlier count of the auxiliary counter. The auxiliary counter also provides the vertical output pulse at a predetermined count if a vertical output pulse is not otherwise provided.

10 Claims, 6 Drawing Figures

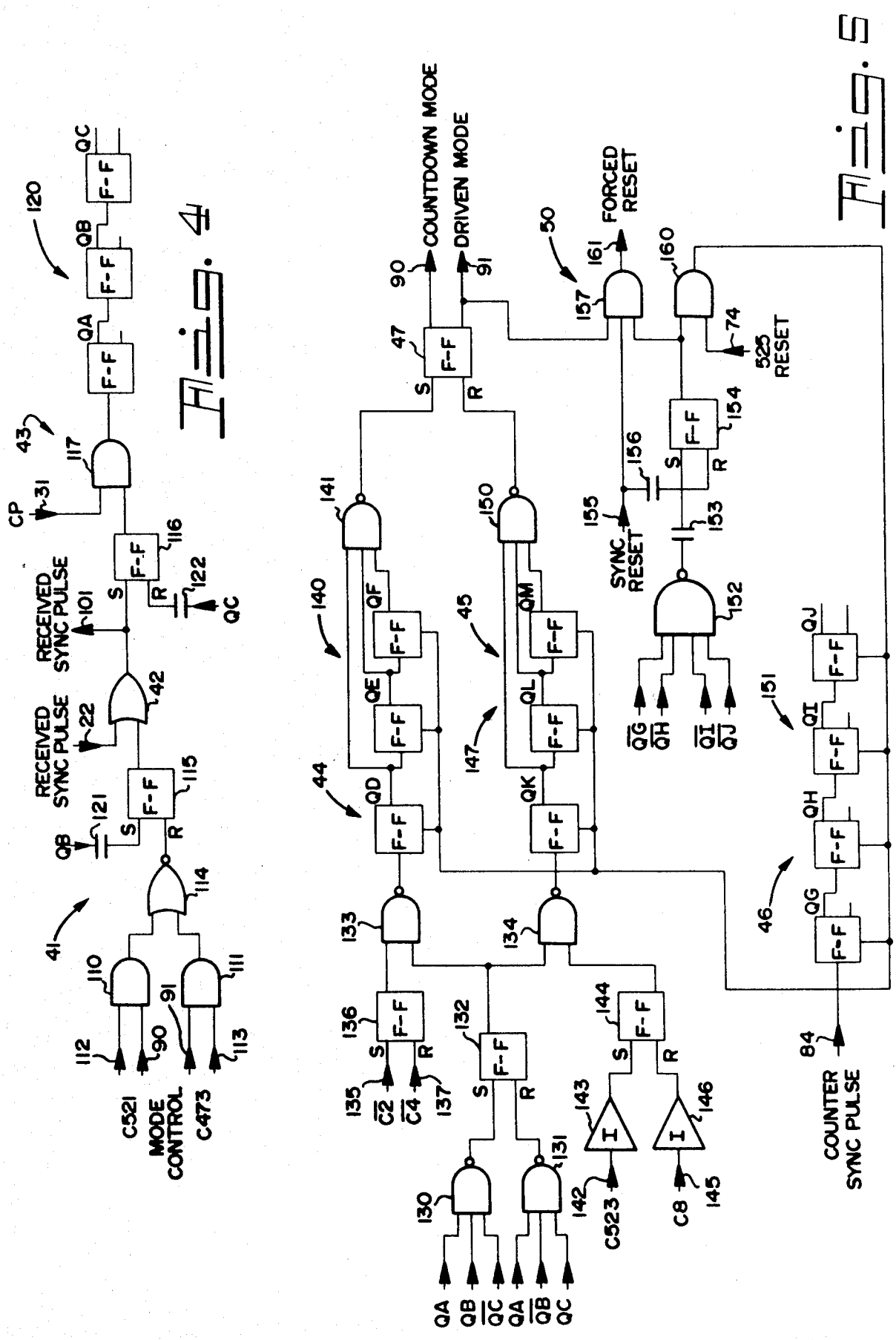

VERTICAL SYNCHRONIZING CIRCUIT HAVING ADJUSTABLE SYNC PULSE WINDOW

CROSS-REFERENCE TO RELATED APPLICATION

R. R. Eckenbrecht et al., "Vertical Synchronizing Circuit," Ser. No. 694,304, and R. R. Eckenbrecht, "Vertical Synchronizing Circuit," Ser. No. 694,239, both filed on the same date and assigned to the same assignee as this application.

FIELD OF THE INVENTION

This invention relates to vertical synchronizing circuitry and more particularly to a vertical countdown circuit.

BACKGROUND OF THE INVENTION

Composite video signals, such as those used in typical television receivers, include video information which is intended for display on a device such as a cathode ray tube. The video information is interspersed between synchronizing pulses to synchronize scanning of the cathode ray tube in the receiver to provide a coherent display. A signal in accordance with current FCC standards has 525 horizontal scanning lines per vertical frame. The vertical frame is divided into two vertical fields, known as the odd and even fields, with each field having 262.5 horizontal lines. If this relationship is maintained exactly, the signal is called interlaced, standard or synchronous.

A typical prior art approach to synchronizing the scanning of a cathode ray tube with the synchronizing pulses of the composite video signal is to provide two oscillators synchronized respectively with the horizontal and vertical synchronizing pulses. While such circuitry has been used for many years with generally satisfactory results, known prior art vertical oscillators are susceptible to noise and have poor stability. Accordingly, with prior art oscillator circuitry, it is necessary to provide a user adjustable hold control to compensate for oscillator drift. Such compensation, however, is generally insufficient to provide proper interlace of the scanning signals under many normal operating conditions. Furthermore, noise signals often cause false triggering of prior art vertical oscillators which deleteriously affects scanning. Also, horizontal pickup by the vertical circuitry may disturb proper interlace.

A technique commonly used to eliminate the vertical oscillator is to provide a countdown circuit which counts pulses provided at, for example, twice the horizontal line rate. Every 525 counts of the counter a vertical output pulse is provided. Systems using a counter are generally called vertical countdown systems since they count down pulses synchronized with the horizontal synchronizing pulses. Of course, a provision must be made for initially synchronizing the counter with the vertical synchronizing pulses of the composite video signal. Also, a provision must be made for periodically testing to ensure that the counter remains synchronized with the vertical synchronizing pulses. Once the counter is properly synchronized, the vertical synchronizing pulses and attendant noise can be essentially locked-out of the system.

In typical prior art vertical countdown systems, the technique for testing to determine whether the counter is properly synchronized is to compare pulses derived from the counter with the vertical synchronizing pulses. If the pulses are out-of-phase, the counter is reset. Since one or more vertical synchronizing pulses may be missing, replaced or obscured by noise or accompanied by noise, some prior art systems require a predetermined number of unsuccessful comparisons before the counter is resynchronized. In such systems, however, signals which do not maintain the 525:1 relationship cause the counter to be resynchronized on a more or less regular basis thereby causing vertical jitter of the display. Such jitter is highly objectionable and can make the display unviewable. Such non-interlaced, non-standard, or asynchronous signals may be provided, for example, in CATV systems, video games, video players, and the like. Since it is highly desirable to provide television receivers with a capability of accomodating non-standard signals, attempts have been made to detect such signals. When non-standard signals are detected, a driven mode of operation is provided so that the vertical output pulses are derived from the vertical synchronizing pulses rather than from the counter.

One prior art system for detecting non-standard signals detects the presence or absence of equalizing pulses or serrations of the vertical synchronizing pulses. It has been found, however, that this technique may be susceptible to noise which can erroneously cause the system to go into the countdown mode. Furthermore, this technique denies the benefit of a countdown mode of operation for signals with a 525:1 relationship which are not accompanied by equalizing pulses or a serrated vertical synchronizing pulse.

Another prior art technique permits the system to remain in the countdown mode until a predetermined number of successive pulses from the counter are non-coincident with the vertical synchronizing pulses. This system suffers from the disadvantages of being unable to correct the counter without reverting to the driven mode so that a non-standard signal very close to a 525:1 relationship will either cause the system to stay in a driven mode or will cause the system to drift between the driven and countdown modes thereby either denying the system the benefit of a countdown mode or causing vertical jitter. Phase errors can also accumulate causing a periodic resynchronization of the counter and attendant vertical jump or jitter of the display. Furthermore, in instances where the received signal is weak and noisy, such prior art systems tend to stay in the driven mode because the vertical synchronizing pulses are not sufficiently regular to permit the system to go into the countdown mode. Thus, the benefits of the countdown mode are denied for weak and noisy signals where the most benefit is derived from a countdown system.

OBJECTS OF THE INVENTION

Accordingly, it is a primary object of this invention to obviate the above-noted and other disadvantages of the prior art.

It is a further object of this invention to provide a vertical synchronizing circuit which is highly noise immune.

It is a further object of this invention to provide a vertical synchronizing circuit with the capability of operating in a countdown mode in the presence of weak and/or noisy composite video signals.

It is a further object of this invention to provide a vertical synchronizing circuit capable of alternative countdown mode and driven mode operation while maintaining a high degree of noise immunity.

It is a further object of this invention to provide a vertical synchronizing circuit which assures acquisition of synchronizing pulses while maintaining a high degree of noise immunity.

It is a further object of this invention to provide a vertical synchronizing circuit which assures acquisition of synchronizing pulses for non-standard signals while maintaining optimum noise immunity.

SUMMARY OF THE INVENTION

In one aspect of this invention the above and other objects and advantages are achieved in a vertical synchronizing circuit for providing vertical output pulses in synchronism with vertical synchronizing pulses contained in a composite video signal. The vertical synchronizing circuit includes means for providing pulses synchronized with horizontal synchronizing pulses contained in the composite video signal, counting means connected to the means for providing pulses for counting the pulses provided thereto, and output means connected to the counting means for providing the vertical output pulses. The vertical synchronizing circuit further includes vertical synchronizing pulse gating means, synchronism detecting means, and gate enabling means. The gating means receives the vertical synchronizing pulses and is connected to the output means. The synchronism detecting means is connected to the counting means and to the gating means for detecting whether the counting means is in-synchronism or out-of-synchronism with the vertical synchronizing pulses. The gate enabling means is connected to the synchronism detecting means, to the counting means, and to the gating means for enabling the gating means at a predetermined count of the counting means when the synchronism detecting means detects an in-synchronism condition and at a predetermined earlier count when the synchronism detecting means detects an out-of-synchronism condition. The gate enabling means inhibits the gating means after a vertical synchronizing pulse is coupled therethrough.

BRIEF DESCRIPTION OF THE DRAWINGS

FIG. 4 is a detailed block diagram of the vertical synchronizing pulse detector of FIG. 1;

FIG. 5 is a detailed block diagram of the countdown and driven mode detectors of FIG. 1.

DETAILED DESCRIPTION OF THE PREFERRED EMBODIMENT

For a better understanding of the present invention, together with other and further objects, advantages, and capabilities thereof, reference is made to the following disclosure and appended claims in connection with the above described drawings.

While the invention will be described in connection with a typical television receiver for receiving an NTSC television signal or its equivalent, those skilled in the art will realize that the invention is usable in video display systems other than television receivers and with television systems other than the NTSC system.

Figure 1:
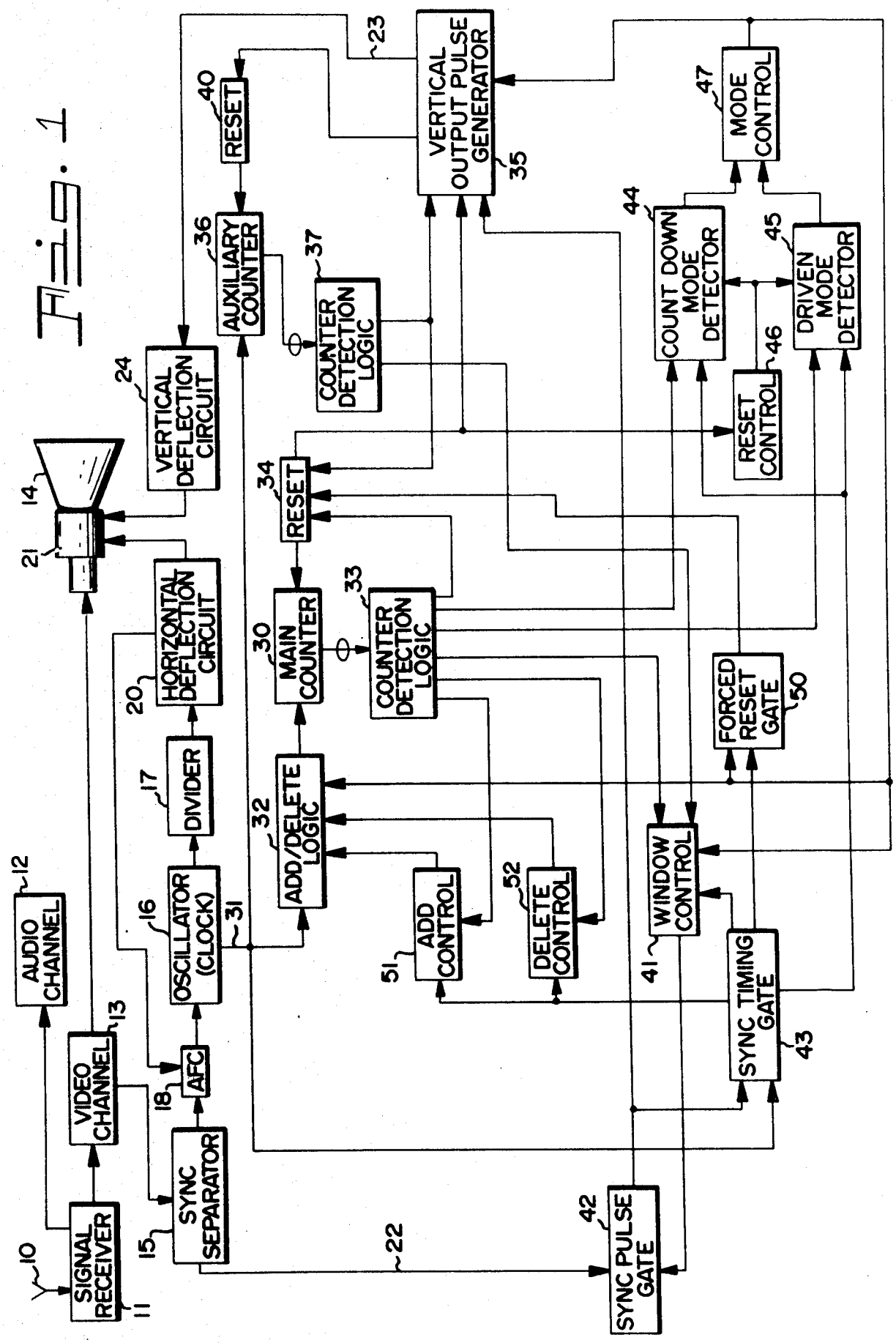
FIG. 1 is a block diagram of a television receiver in accordance with a preferred embodiment of the invention.

In FIG. 1 an antenna 10 or equivalent signal providing means is connected to a signal receiver 11 which processes the received signal to provide the sound portion thereof to an audio channel 12 and the video portion to a video channel 13. Video channel 13 further processes the composite video signal to provide one or more video signals to an image display device illustrated as a cathode ray tube (CRT) 14. Video channel 13 also provides at least the synchronizing pulses of the composite video signal to a means for providing vertical and horizontal synchronizing pulses illustrated as a synchronizing pulse separator 15.

Sync separator 15 separates the synchronizing pulses from the composite video signal and couples the horizontal synchronizing pulses to an AFC circuit 18. AFC circuit 18 provides a control signal to an oscillator 16. Oscillator 16 can conveniently be arranged to oscillate at twice the horizontal or line deflection rate to serve as a clock for the vertical synchronizing circuit. The output pulses from oscillator 16 are coupled via a divider 17 to a horizontal deflection circuit 20. An output of horizontal deflection circuit 20 is coupled to AFC circuit 18 to lock the frequency and phase of the horizontal deflection to the received synchronizing pulses. Divider 17 divides the oscillator output pulses to provide pulses of the proper rate or frequency to horizontal deflection circuit 20. Horizontal deflection circuit 20 provides suitable deflection signals to the horizontal deflection windings of a deflection yoke 21 associated with CRT 14.

Sync separator 15 also provides separated vertical synchronizing pulses via a lead 22 to a vertical synchronizing circuit which provides vertical output pulses via a lead 23 to a vertical deflection circuit 24. Vertical deflection circuit 24 provides suitable vertical deflection signals to the vertical deflection windings of yoke 21.

The vertical synchronizing circuit provides vertical output pulses on lead 23 synchronized with vertical synchronizing pulses provided on lead 22 which are, in turn, separated from and synchronized with the composite video signal provided by video channel 13. The vertical synchronizing circuit includes a counting means illustrated as including a main counter 30. Oscillator 16 comprises a means for providing pulses synchronized with horizontal synchronizing pulses contained in the composite video signal. The pulses are provided via a lead 31 and add/delete logic 32 to an input of main counter 30.

In the countdown mode counter 30 counts the pulses provided thereto at twice the horizontal deflection rate. Various outputs from counter 30 are connected to a count detecting means or count detection logic 33. Count detection logic 33 includes a plurality of gates for detecting various counts of counter 30. When counter 30 reaches a predetermined count such as a count of 525, logic 33 provides a reset signal to a resetting means illustrated as a reset 34 which resets counter 30. Reset 34 also provides a counter sync pulse to a vertical output pulse generator 35. In the countdown mode of operation, the counting means causes vertical output pulse generator 35 to provide a vertical output pulse on lead 23. Accordingly, vertical output pulse generator 35 comprises an output means for providing the vertical output pulses.

The counting means further includes an auxiliary counting means illustrated as a counter 36 having an input connected to lead 31 for receiving the pulses thereon. A count detecting means or count detection logic 37 receives various outputs from auxiliary counter 36 and provides an output signal to vertical output pulse generator 35 and reset 34. Vertical output pulse generator 35 also provides an output signal via a reset 40 to a reset input of auxiliary counter 36 so that auxiliary counter 36 is reset each time generator 35 provides a vertical output pulse. The circuitry corresponding to components numbered 30–40 will be described in more detail in connection with FIG. 2.

Count detection logics 33 and 37 provide signals at particular counts to a gate enabling means window control 41 which provides an output signal to a gating means or sync pulse gate 42. Sync pulse gate 42 also receives vertical synchronizing pulses via lead 22. Gate 42 provides output pulses to sync timing gates 43 and to vertical output pulse generator 35.

Window control 41 in response to a pulse from one of logics 33 and 37 enables gate 42. Gate 42 comprises a means for providing the vertical synchronizing pulses which are coupled therethrough to generator 35 and gate 43 when gate 42 is enabled. Sync timing gates 43 receive the pulses via lead 31 and include a counter which is started by each pulse from gate 42. The counter counts pulses until a predetermined count is reached at which time window control 41 inhibits gate 42 until the appropriate enablement signal is received from one of logics 33 and 37. Window control 41 and gate 42 are shown in more detail in FIG. 4.

Sync timing gates 43 comprise a means for providing signals synchronized with the vertical synchronizing pulses. Gates 43 provide a signal to an input of a synchronism detecting means illustrated as inputs of a countdown mode detector 44 and a driven mode detector 45. Detectors 44 and 45 also receive inputs from logic 33. A reset control 46 receives an input from reset 34 and provides outputs to detectors 44 and 45 which also provide outputs to a mode control means 47. Sync timing gates 43 are shown in more detail in FIGS. 4–6 while the circuitry in blocks 44–47 is shown in more detail in FIG. 5.

Mode control 47 provides outputs to generator 35 and window control 41. In the driven mode, mode control 47 causes generator 35 to select the input from sync pulse gate 42 and causes window control 41 to select the input from logic 37. When the television receiver is initially turned on or a new channel is selected, counters 30 and 36 will be at some arbitrary count with respect to the vertical synchronizing pulses. Accordingly, window control 41 will enable gate 42 at some arbitrary time with respect to the sync pulses. Assuming mode control 47 is in the driven mode, the first received sync pulse is coupled via gate 42 to generator 35 which resets auxiliary counter 36 and provides a vertical output pulse on lead 23. If mode control 47 is initially in the countdown mode, an out-of-synchronism condition will be detected and mode control 47 will switch to the driven mode. Logic 37 detects a particular count of counter 36 and provides a pulse window control 41 to enable gate 42 at a predetermined time or count prior to when the next succeeding vertical sync pulse from a non-standard composite video signal is expected on lead 22.

Sync timing gates 43 and mode control 47 also provide inputs to a forced reset gate 50 which provides an output to reset 34. When mode control 47 is in the driven mode, gate 50 is enabled and at an appropriate time with respect to a vertical sync pulse, counter 30 is reset. Gate 50, accordingly, comprises a means for resetting the counting means in synchronism with the vertical synchronizing pulses when an out-of-synchronism condition is detected.

Countdown mode detector 44 receives comparison signals from logic 33 and gates 43. If the comparison signals are coincident for a predetermined number of vertical fields, an in-synchronism condition is detected and detector 44 causes mode control 47 to switch to the countdown mode. In the countdown mode, mode control 47 causes generator 35 to select the output from reset 34 causes window control 41 to select the output from logic 33, and inhibits gate 50. In the countdown mode window control 41 enables gate 42 a predetermined short time prior to when a vertical sync pulse is expected so that noise is effectively locked out of the system.

In the countdown mode detector 45 compares comparison signals from logic 33 and gates 43. If the comparison signals are not coincident for a predetermined number of vertical fields, an out-of-synchronism condition is detected and mode control 47 is switched to the driven mode. Reset control 46 counts pulses from reset 34 and resets detectors 44 and 45 periodically so that noise build-up or erroneous operation due to occasional missing sync pulses does not occur.

In the driven mode generator 35 will not provide a vertical output pulse if the sync pulse is missing. Logic 37 detects a predetermined count of counter 36 subsequent to the time a sync pulse is expected and provides an output to generator 35 so that generator 35 will provide a vertical output pulse and the vertical scan will not collapse. The output from logic 37 also causes counters 30 and 36 to reset. Accordingly, counter 36 prevents scan collapse due to missing sync pulses and provides an earlier enablement signal from window control 41 to gate 42. The tolerance provided by counter 36 and logic 37 is such that gate 42 is open prior to the earliest time that a vertical sync pulse is expected in a non-standard signal. Similarly, the pulse to generator 35 is provided at a time subsequent to the latest vertical sync pulse expected from a non-standard signal.

Sync timing gates 43 also provide signals to an add control 51 and a delete control 52. Controls 51 and 52 receive inputs from logic 33 and provide outputs to logic 32. Blocks 32, 51, and 52 comprise a phase detecting means and a control means. The phase detecting means detects phase errors greater than a predetermined magnitude between the counting of the counting means and the vertical synchronizing pulses. The control means advances or retards the counting means in response to detected phase errors of first and second directions, respectively, which persist for a plurality of vertical fields.

Gates 43 provide a pulse for a predetermined timing interval in response to a vertical sync pulse. If this timing interval overlaps predetermined counts of counter 30, one of controls 51 and 52 depending on the direction of the phase error provides a signal to logic 32. Logic 32 advances or retards counter 30 by adding or deleting one count or pulse so that the phase error is decreased. An output from mode control 47 is connected to logic 35 to inhibit the phase correction during the driven mode of operation.

In normal operation with standard interlaced signals, phase errors may be encountered due to camera or signal source switching at the studio. Also, signals close to a 525:1 relationship may be encountered in CATV systems, video games, or other video signal sources. The phase adjustment permits the vertical synchronizing circuit to stay in the countdown mode even though small phase errors exist. Furthermore, the phase control inhibits unnecessary mode switching so that objectionable vertical jitter is avoided by preventing phase error build-up or accumulation.

Figure 2:
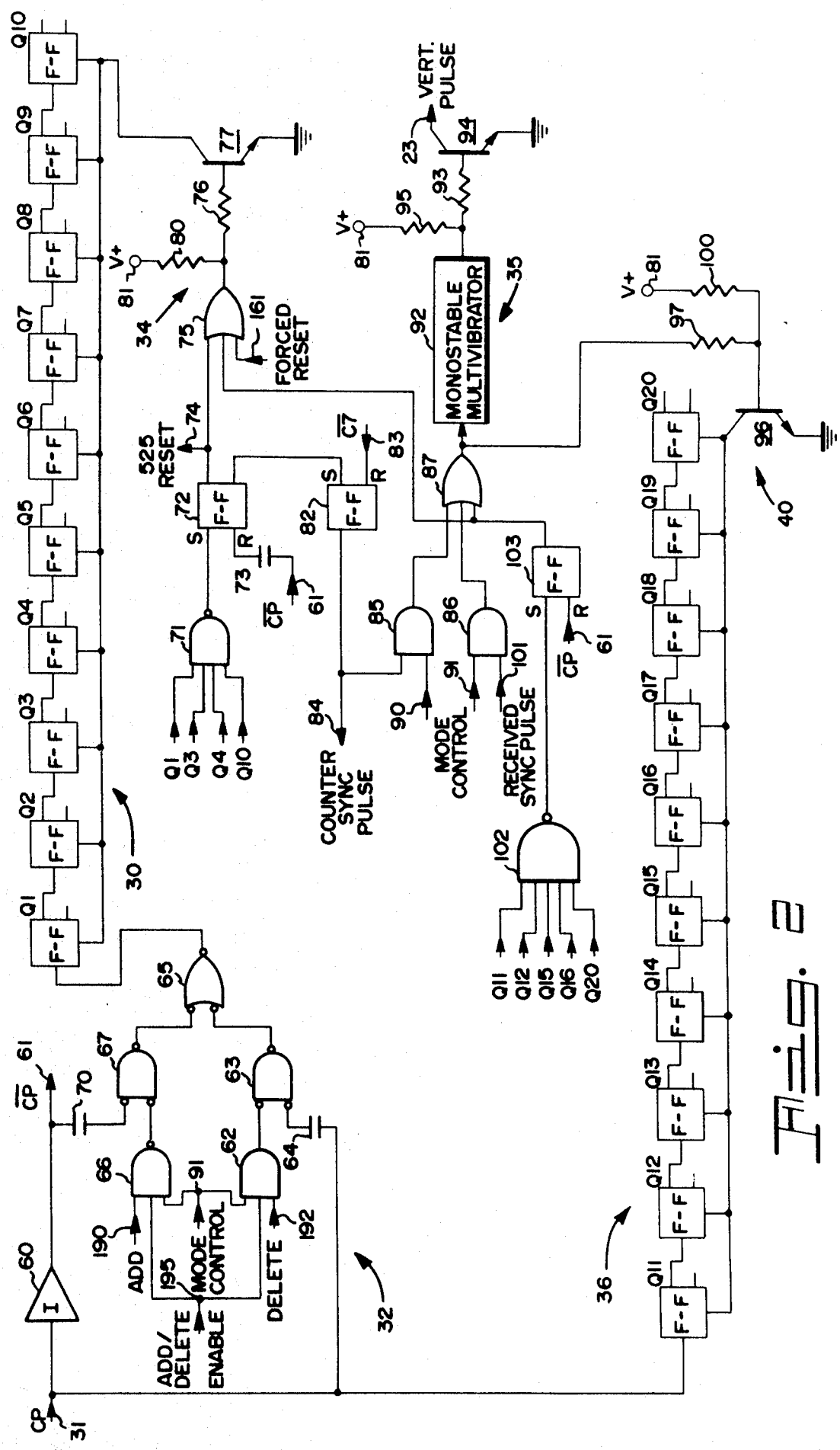
FIG. 2 is a detailed block diagram of the counters and associated circuitry of FIG. 1.

FIG. 2 is a more detailed block diagram of counters 30 and 36 and generator 35 together with associated circuitry. Clock pulses CP from oscillator 16 are provided by a lead 31 to an inverter 60 which provides a $\overline{CP}$ pulse train on a lead 61. Add/delete logic 32 includes gating means for coupling the CP pulses to counter 30 and for adding or deleting pulses to adjust the phase of counter 30. A first gating means includes a gate illustrated as an AND gate 62 which has an output coupled to an input of a gate illustrated as an OR gate 63. Lead 31 is coupled by a capacitor 64 to a second input of OR gate 63 which has an output coupled to an input of a gate illustrated as an AND gate 65. A second gating means includes a gate illustrated as a NAND gate 66 which has an output connected to an input of a gate illustrated as an OR gate 67. Lead 61 is connected by capacitor 70 to a second input of OR gate 67 which has an output connected to a second input of AND gate 65.

Figure 6:
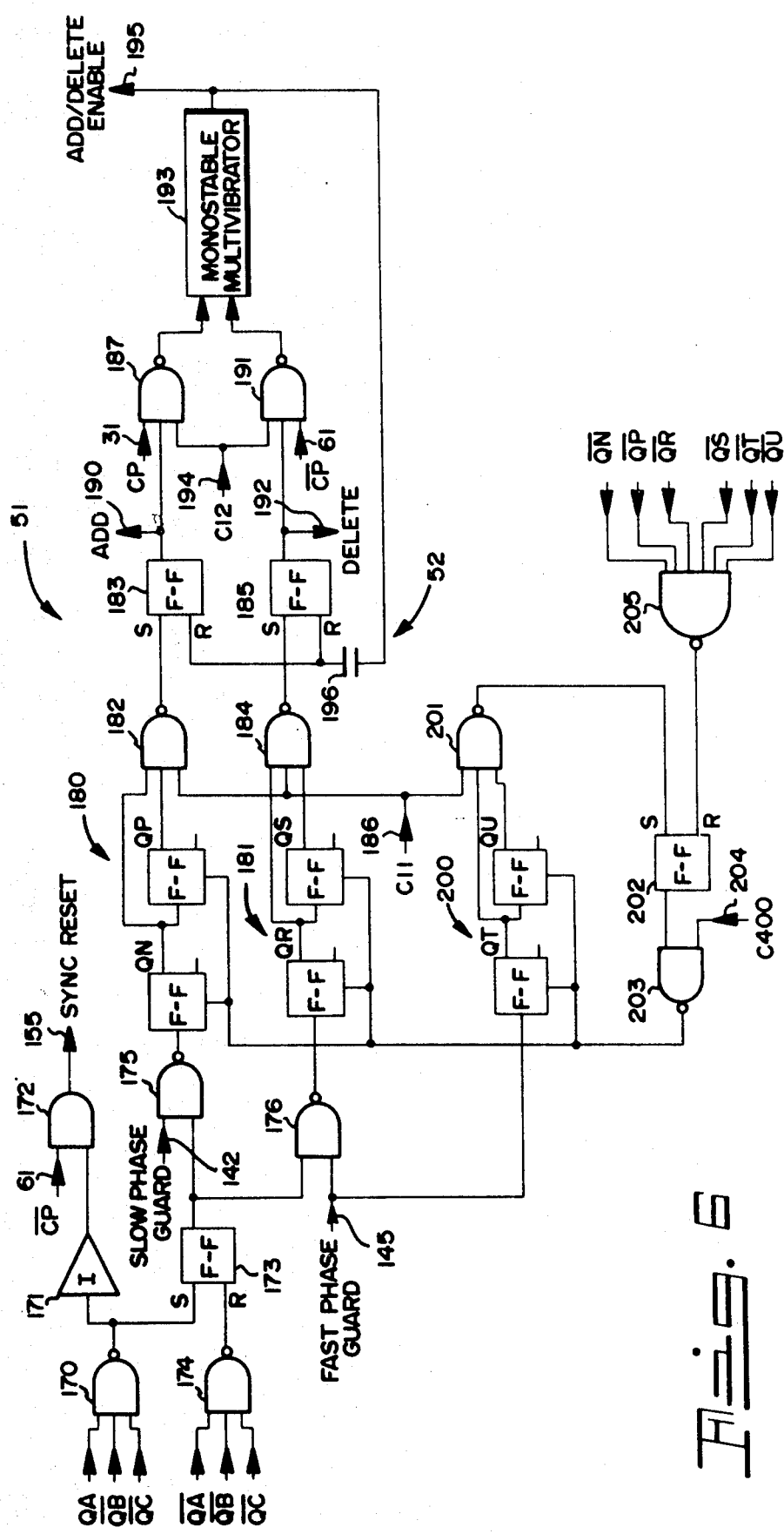
FIG. 6 is a detailed block diagram of the phase control means of FIG. 1.

Gates 62 and 66 receive various inputs from FIGS. 5 and 6. The inputs to gate 66 cause gate 66 to normally provide a 1 output to gate 67 which provides a 1 output to gate 65. Thus, the $\overline{CP}$ pulses coupled to gate 67 have no effect at its output. Gate 62 normally provides a 0 output to gate 63. The leading and trailing edges of CP pulses are differentiated by capacitor 64 and the differentiated pulses are coupled to the input of gate 63. Gates 63 and 65 couple pulses corresponding to trailing edges of the CP pulses to counter 30.

Counter 30 is illustrated as a ten-stage binary counter. Each stage can include, for example, a J-K flip-flop which has a clock input, a reset input, a Q output connected to the clock input of the succeeding stage, and a $\overline{Q}$ output which is the inverse of the Q output. Pulses from gate 65 are coupled to the clock input of the first stage of counter 30.

Figure 3:
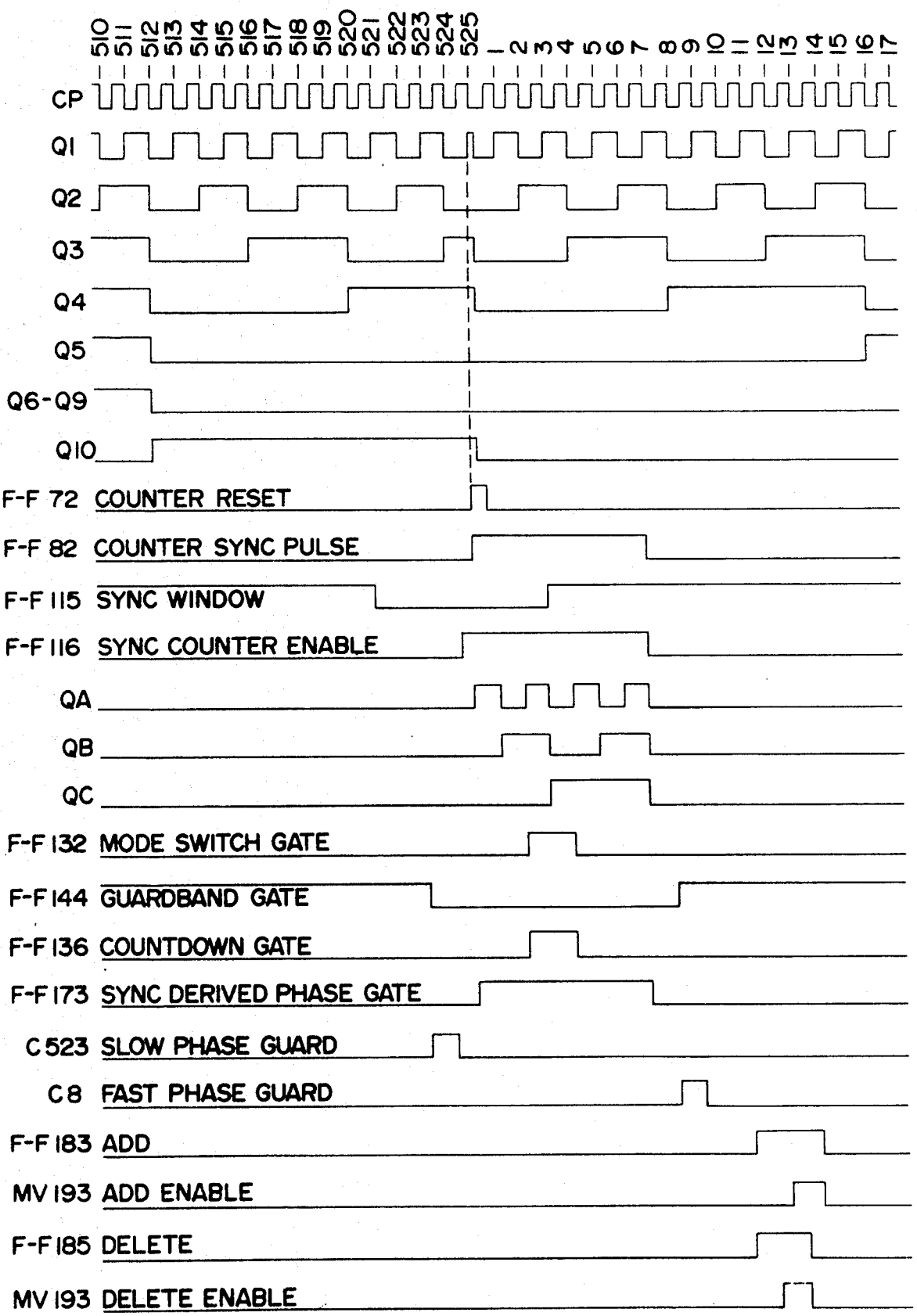
FIG. 3 is a timing diagram to aid in explaining the operation of the invention.

FIG. 3 is a timing diagram which illustrates various signals obtained during normal countdown operation. The timing diagram covers a range of counts in the vicinity of the reset of counter 30. The CP pulses from count 510 to count 17 of counter 30 cause counter 30 to provide the various illustrated Q1-Q10 outputs. The Q1, Q3, Q4 and Q10 outputs of counter 30 are applied to a NAND gate 71 which provides a 0 output at count 525 of counter 30. NAND gate 71 is part of count detection logic 33. Reset 34 includes an RS flip-flop 72 which has a set input connected to the output of NAND gate 71. The $\overline{CP}$ pulses on lead 61 are coupled by a capacitor 73 to a reset input of flip-flop 72. When flip-flop 72 is set by a zero output of NAND gate 71, the next succeeding trailing edge of a $\overline{CP}$ pulse resets flip-flop 72. The counter reset or 525 reset pulse provided by flip-flop 72 on a lead 74 is illustrated in FIG. 3.

Lead 74 is connected to a first input of an OR gate 75 which has an output connected by a resistor 76 to a base of a transistor 77. The output of OR gate 75 is further connected by a resistor 80 to a source of potential +V illustrated as a terminal 81. An emitter of transistor 77 is connected to circuit ground and a collector is connected to the reset inputs of the flip-flops of counter 30. Transistor 77 is normally non-conducting due to the zero output from OR gate 75. When flip-flop 72 provides a 1 output on lead 74, OR gate 75 provides a 1 output to turn transistor 77 on and reset all of the flip-flops of counter 30 to their Q=0 states.

Reset 34 further includes an RS flip-flop 82 which has a set input connected to a second output of flip-flop 72. When the 525 reset pulse is provided by flip-flop 72, a 0 is provided to the set input of flip-flop to set flip-flop 82. Count detection logic 33 detects count 7 of counter 30 in accordance with the logic equation:

$$\overline{C7} = Q1.Q2.Q3.\overline{Q4}.\overline{Q5}.\overline{Q6}.\overline{Q7}.\overline{Q8}.\overline{Q9}.\overline{Q10} \qquad (1)$$

to provide a $\overline{C7}$ pulse via a lead 83 to a reset input of flip-flop 82. Flip-flop 82 provides the counter sync pulse illustrated in FIG. 3 on a lead 84. Those skilled in the art will realize that the counter sync pulse can be terminated at counts other than count 7.

Generator 35 includes a pair of mode control gates illustrated as AND gates 85 and 86. Gate 85 has an input connected to lead 84 and an output connected to a first input of an OR gate 87. Inputs from mode control 47 are provided via leads 90 and 91 to inputs of gates 85 and 86, respectively. When the synchronizing circuit is in the countdown mode, gate 85 is enabled by a 1 on lead 90 while gate 86 is inhibited by a 0 on lead 91. Accordingly, the counter sync pulse is coupled via gate 85 and gate 87 to an input of a monostable multivibrator 92. Multivibrator 92 has an output connected by a resistor 93 to a base of a transistor 94. The output of multivibrator 92 is further connected by a resistor 95 to source 81. Transistor 94 has an emitter connected to circuit ground and a collector connected to lead 23. Multivibrator 92 is triggered by the counter sync pulse to provide an output pulse of a suitable duration to the base of transistor 94 which provides the vertical output pulse at its collector.

Auxiliary counter 36 is illustrated as a ten-stage counter with each stage comprising a J-K flip-flop. The flip-flops provide Q11-Q20 outputs. Lead 31 couples CP pulses to the input of the first flip-flop of counter 36. Reset 40 includes a transistor 96 which has a collector connected to the reset inputs of the flip-flops of counter 36 and an emitter connected to circuit ground. A base of transistor 96 is connected by a resistor 97 to the output of gate 87 and by a resistor 100 to source 81. Each output pulse from gate 87 switches transistor 96 on to reset counter 36. Accordingly, in the countdown mode counter 36 counts in step with counter 30.

When the vertical synchronizing circuit is in the driven mode, mode control 47 provides a 0 on lead 90 to inhibit gate 85 so that the counter sync pulse does not trigger generator 35. Correspondingly, a 1 is provided on lead 91 to enable gate 86. Received sync pulses are coupled to a second input of gate 86 via a lead 101 which couples the received sync pulses to a second input of OR gate 87. In the driven mode the received sync pulses trigger monostable multivibrator 92 to provide the vertical output pulses. The output pulses from gate 87 in response to received sync pulses also reset auxiliary counter 36. If one or more sync pulses are missing in the driven mode, however, no vertical output pulse will be provided and the vertical scan of CRT 14 will collapse. A collapsed vertical scan may cause screen burn in CRT 14 and other serious problems.

Count detection logic 37 include a gate illustrated as a NAND gate 102 which receives the Q11, Q12, Q15, Q16, and Q20 outputs of counter 36. Gate 102 detects count 563 of counter 36 and provides a 0 to a set input of an RS flip-flop 103. The $\overline{CP}$ pulses on lead 61 are coupled to the reset input of flip-flop 103 so that the next succeeding $\overline{CP}$ pulse resets flip-flop 103. The 1 output of flip-flop 103 during count 563 of counter 36 is coupled to a third input of OR gate 87 to trigger monostable multivibrator 92 and provide a vertical output pulse. The 1 output from flip-flop 103 also is coupled to a second input of OR gate 75 to reset counter 30 when a sync pulse is missing during the driven mode. The particular count detected by NAND gate 102 is arbitrary, however, it should be subsequent to the longest expected interval between vertical synchronizing pulses in equipment such as video games, CATV systems, video players, and the like. Accordingly, counter 36 prevents the vertical synchronizing circuit from omitting a vertical output pulse when a received sync pulse is missing.

In FIG. 4 sync window control 41 includes a pair of gates illustrated as AND gates 110 and 111 which have inputs connected to mode control outputs 90 and 91, respectively. In the countdown mode gate 110 is enabled while in the driven mode gate 111 is enabled. Count detection logic 33 detects count 521 of counter 30 in accordance with the logic equation:

$$C521 = Q1.\overline{Q2}.\overline{Q3}.Q4.Q10 \qquad (2)$$

and couples a C521 pulse corresponding to the detected count on a lead 112 to a second input of gate 110. Similarly, count detection logic 37 detects count 473 of counter 36 in accordance with the logic equation:

$$C473 = Q11.\overline{Q12}.\overline{Q13}.Q14.Q15.\overline{Q16}.Q17.Q18.Q19.\overline{Q20} \qquad (3)$$

and couples a C437 pulse via a lead 113 to a second input of gate 111. The outputs of gates 110 and 111 are connected to first and second inputs of a gate illustrated as a NOR gate 114 which has an output connected to a bistable circuit illustrated as a reset input of an RS flip-flop 115. Flip-flop 115 is a window control flip-flop which provides a sync window to sync pulse gate 42 illustrated as an OR gate in FIG. 4. A second input of gate 42 is connected to lead 22 and receives vertical sync pulses. Gate 42 has an output connected to lead 101 which couples the received sync pulses to gate 86 of FIG. 2.

Flip-flop 115 is normally in a first stage or set to provide a 1 output to gate 42 which inhibits gate 42 from coupling any pulses on lead 22 therethrough. Accordingly, any noise which may be provided by sync separator 15 of FIG. 1 is not coupled through gate 42 and is effectively blocked from the vertical synchronizing circuit.

In the countdown mode gate 110 is enabled by the mode control so that at count 521 of counter 30 a pulse is coupled via gates 110 and 114 to switch flip-flop 115 to a second state or reset flip-flop 115 to provide a 0 output to gate 42. Now the sync window is open so that the next pulse on lead 22 is coupled via gate 42 to lead 101. The sync window pulse from flip-flop 115 is illustrated in FIG. 3 for the countdown mode.

The output of gate 42 is also connected to a set input of a flip-flop 116 which enables the sync counter. The output of flip-flop 116 is connected to a first input of a gate illustrated as an AND gate 117 which also receives the CP pulses via lead 31 at a second input. When flip-flop 116 is reset, gate 117 is inhibited. When a sync pulse sets flip-flop 116, gate 117 is enabled to couple CP pulses to a sync or ABC counter 120. Accordingly, counter 120 counts CP pulses when it is enabled by a sync counter enable signal from flip-flop 116 in response to a received sync pulse. The sync counter enable pulse from flip-flop 116 is illustrated in FIG. 3.

Counter 120 is a three-stage counter with each stage illustrated as including a flip-flop that provides respective QA, QB, and QC outputs. The QB output is coupled by a capacitor 121 to a set input of flip-flop 115. The QC output is coupled by a capacitor 122 to a reset input of flip-flop 116. Referring to FIG. 3, the QA, QB, and QC outputs of counter 120 are illustrated. Flip-flop 115 is switched or set on the trailing edge of a QB output pulse to end the sync window until counter 30 again reaches a count of 521. Flip-flop 116 is reset on the trailing edge of a QC output pulse from counter 120 to terminate the sync counter enable signal. Thus, counter 120 is enabled until it recycles to its zero state.

In the driven mode gate 111 is enabled by the mode control signal on lead 91 so that count 473 of counter 36 causes flip-flop 115 to open the sync window which again remains open until a sync pulse is received on lead 22. Gate 110 is inhibited in the driven mode by the signal on lead 90. Flip-flop 116 provides a sync counter enable signal and counter 120 counts CP pulses the same as in the countdown mode.

Accordingly, during countdown operation any pulses which may be provided by sync separator 15 are blocked until shortly before a sync pulse is expected at which time the circuitry begins "looking" for a sync pulse. Once the circuit starts looking for a sync pulse, it continues looking until a sync pulse is received. The operation is the same for the driven mode except that the circuit begins looking for a sync pulse at an earlier time to accommodate non-standard signals which may have a vertical scan rate significantly higher than the standard rate of approximately 60Hz. While counts 521 and 473 are somewhat arbitrary, and other counts can be used as well, the particular counts selected for opening the sync window are preferably as close to 525 as feasible to lock-out as much received noise as possible.

FIG. 5 is a more detailed block diagram of the mode detector and control circuitry. A gating means illustrated as NAND gates 130 and 131 have outputs connected to the set and reset inputs, respectively, of an RS flip-flop 132 which has an output connected to an input of a comparing means illustrated as first inputs of comparators or NAND gates 133 and 134. NAND gates 133 and 134 comprise the inputs to countdown mode detector 44 and driven mode detector 45, respectively. Gate 130 receives the QA, QB, and QC outputs of counter 120 of FIG. 4. Gate 131 receives the QA, QB, and QC outputs from counter 120. Accordingly, when counter 120 counts the third clock pulse applied thereto, gate 130 sets flip-flop 132. Gate 131 resets flip-flop 132 on the fifth count of counter 120 so that flip-flop 132 is set for two periods of the CP pulses. The output of flip-flp 132 is the mode switch gate illustrated in FIG. 3.

Count detection logic 33 detects count 2 of counter 30 in accordance with the logic equation:

$$\overline{C2} = \overline{Q1}.Q2.\overline{Q3}.\overline{Q4}.\overline{Q5}.\overline{Q6}.\overline{Q7}.\overline{Q8}.\overline{Q9}.\overline{Q10} \qquad (4)$$

and couples a $\overline{C2}$ pulse via a lead 135 to a set input of an RS flip-flop 136. Count detection logic 33 also detects count 4 in accordance with logic equation:

$$\overline{C4} = \overline{Q1}.\overline{Q2}.Q3.\overline{Q4}.\overline{Q5}.\overline{Q6}.\overline{Q7}.\overline{Q8}.\overline{Q9}.\overline{Q10} \qquad (5)$$

and couples a $\overline{C4}$ pulse via a lead 137 to a reset input of flip-flop 136. The output of flip-flop 136 is coupled to a second input of gate 133. Accordingly, flip-flop 136 is set for two counts of counter 30 to provide the countdown gate pulse, illustrated in FIG. 3, to gate 133. If any portions of the mode switch gate from flip-flop 132 and the countdown gate from flip-flop 136 are coincident, gate 133 will provide a 0 output.

Countdown mode detector 44 further includes a counter illustrated as a three-stage J-K flip-flop counter 140 which provides QD, QE, and QF outputs to a NAND gate 141. The output of gate 133 is connected to the input of counter 140. Mode control 47 is illustrated as an RS flip-flop which has a set input connected to the output of gate 141 and provides a countdown mode output on lead 90 and a driven mode output on lead 91.

If the synchronizing circuit is in the driven mode, flip-flop 47 is reset so that the countdown mode output on lead 90 is a 0 and the driven mode output on lead 91 is a 1 to properly enable and inhibit the various gates connected thereto. Counter 140 counts the 0 outputs from gate 133. If seven coincidences of the mode switch gate and countdown gate are detected, gate 141 provides a 0 to the set input of flip-flop 47 to switch the mode control to the countdown mode.

Count detection logic 33 detects count 523 of counter 30 in accordance with the logic equation:

$$C523 = Q1.Q2.\overline{Q3}.Q4.Q10 \qquad (6)$$

and couples a C523 pulse via a lead 142 and an inverter 143 to a set input of an RS flip-flop 144. Count detection logic 33 also detects count 8 in accordance with the logic equation:

$$C8 = \overline{Q1}.\overline{Q2}.\overline{Q3}.Q4.\overline{Q5}.\overline{Q6}.\overline{Q7}.\overline{Q8}.\overline{Q9}.\overline{Q10} \qquad (7)$$

and couples a C8 pulse via a lead 145 and an inverter 146 to a reset input of flip-flop 144. Flip-flop 144 provides a 0 guard band gate illustrated in FIG. 3, from count 523 to count 8 to the second input of gate 134. If the mode switch gate or any portion thereof is outside the guard band gate, gate 134 will provide a 0 output.

Driven mode detector 45 includes a counter 147 illustrated as a three-stage J-K flip-flop counter which provides QK, QL, and QM outputs to a NAND gate 150. Counter 147 counts non-coincidences of the guard band gate and mode switch gate. If counter 147 attains a count of seven, gate 150 will provide a 0 output to the reset input of flip-flop 47 to switch the mode control to the driven mode.

Accordingly, counter 140 and its associated circuitry detects an in-synchronism condition of the vertical synchronizing pulses and counter 30 while counter 147 detects an out-of-synchronism condition. In either case the condition must persist for seven vertical fields before the mode control is switched. To prevent error build up which could be caused by random noise during the driven mode or missed sync pulses during the countdown mode, counters 140 and 147 are periodically reset by reset control 46 to require the seven vertical fields to be consecutive before mode control 47 is switched. Reset control 46 includes a counter 151 illustrated as a four-stage J-K flip-flop counter which provides QG, QH, QI, and QJ outputs. The counter sync pulses on lead 84, which occur once per vertical field, are coupled to the input of counter 151. Accordingly, counter 151 counts vertical fields.

The $\overline{QG}$, $\overline{QH}$, $\overline{QI}$, and QJ outputs of counter 151 are connected to inputs of a NAND gate 152 which has an output connected by a capacitor 153 to a set input of an RS flip-flop 154. A sync reset pulse, provided from FIG. 6 which will be described hereinafter, is coupled via a lead 155 and a capacitor 156 to a reset input of flip-flop 154. Flip-flop 154 has an output connected to inputs of AND gates 157 and 160. AND gate 157 also receives inputs from lead 91 of mode control 47 and from lead 155. Gate 157 provides the forced reset pulse on lead 161 which is connected to reset 34 of FIG. 1 and gate 75 of FIG. 2. The 525 reset pulse on lead 74 is coupled to a second input of gate 160 which has an output connected to the reset inputs of the flip-flops of counters 140, 147, and 151.

When counter 151 reaches a count of 8, gate 152 provides a 0 output to set flip-flop 154 and enable gate 160. The next 525 reset pulse on lead 74 is coupled through gate 160 to reset counters 140, 147, and 151 to assure that noise buildup does not occur in counters 140 and 147. Thus, the mode switch gate from flip-flop 132 and the countdown gate from flip-flop 136 must be coincident for seven consecutive vertical fields for an in-synchronism condition to be detected. Similarly, non-coincidences of the mode switch gate from flip-flop 132 and the guard band gate from flip-flop 144 must occur in seven consecutive vertical fields for an out-of-synchronism condition to be detected.

In the driven mode gate 157 is enabled by the output from mode control 47 on lead 91. When gate 152 sets flip-flop 154, gate 157 is further enabled so that the next sync reset pulse from lead 155 is coupled therethrough to lead 161 to reset counter 30. The sync reset pulse on lead 155 is timed, as will be explained hereinafter, so that counter 30 is reset at the proper time. The sync reset pulse on lead 155 also resets flip-flop 154 to inhibit gate 157. Accordingly, 157 does not provide further forced reset pulses on lead 161 until after 8 vertical fields during which time countdown mode detector 44 is testing for an in-synchronism condition. When mode control 47 is switched to the countdown mode, gate 157 is inhibited to prevent forced resets of counter 30 during countdown mode operation.

FIG. 6 is a more detailed block diagram of add control 51 and delete control 52. The QA, $\overline{QB}$, and $\overline{QC}$ outputs of counter 120 of FIG. 4 are connected to inputs of a NAND gate 170 which has an output connected by an inverter 171 to a first input of an AND gate 172. Lead 61 couples $\overline{CP}$ pulses to a second input of gate 172 which has an output connected to lead 155 to provide the sync reset pulses to gate 157 of FIG. 5. Accordingly, the sync reset pulses are timed to reset counter 30 at the proper time with respect to the received sync pulses.

The output of gate 170 is further connected to set input of an RS flip-flop 173. The $\overline{QA}$, $\overline{QB}$, and $\overline{QC}$ outputs of counter 120 are connected to inputs of a NAND gate 174 which has an output connected to a reset input of flip-flop 173. Gate 170 sets flip-flop 173 on the first count of counter 120 and gate 174 resets flip-flop 173 when counter 120 recycles to a count of 0. Accordingly, flip-flop 173 provides a sync derived phase gate during the time that counter 120 is counting.

The output of flip-flop 173 is connected to the input of a phase detecting means illustrated as first inputs of first and second phase detectors or NAND gates 175 and 176. Lead 142 couples a pulse corresponding to a first count illustrated as count 523 from count detection logic 33 to a second input of gate 175. Lead 145 couples a pulse corresponding to a second count illustrated as count 8 to a second input of gate 176. C523 is the slow phase guard which is compared in gate 175 with the sync derived phase gate from flip-flop 173. C8 is the fast phase guard which is compared in gate 176 with the sync derived phase gate. The sync derived phase gate, the slow phase guard, and the fast phase guard are illustrated in FIG. 3. If counter 30 is slow, C523 will overlap the sync derived phase gate so that gate 175 will provide a 0 output. Similarly, if counter 30 is fast, C8 will overlap the sync derived phase gate so that gate 176 will provide a 0 output.

The outputs of phase detector gates 175 and 176 are coupled to a control means which advances or retards counter 30 in response to detected phase errors of first and second directions, respectively, which persist for a plurality of vertical fields. In the preferred embodiment, counter 30 is advanced or retarded one count each operating cycle of the control means. The control means includes a counting means for counting the number of fields in which a phase error exists. The control means further includes gating means connected to the phase error counting means for deleting one pulse or adding one pulse to the pulses provided at the input of counter 30 when a predetermined number of fields has been counted by the phase error counting means.

The phase error counting means is illustrated as including a first counter 180 illustrated as a two-stage J-K flip-flop counter which provides QN and QP outputs. The counting means further includes a second counter 181 also illustrated as a two-stage J-K flip-flop counter which provides QR and QS outputs. The output of gate 175 is connected to the input of counter 180, while the output of gate 176 is connected to the input of counter 181. Counter 180 counts the number of instances when the slow phase guard and the sync derived phase gate overlap while counter 181 counts the number of instances that the fast phase guard and the sync derived phase gate overlap. When a predetermined number of fields has been counted by either counter 180 or counter 181, one count is added or deleted at the input of counter 30. In the specific illustrated embodiment, the predetermined number of fields is three vertical fields.

Accordingly, the QN and QP outputs of counter 180 are connected to inputs of a gating means illustrated as a NAND gate 182 which has an output connected to a set input of an RS flip-flop 183. The QR and QS outputs of counter 180 are connected to inputs of a gating means illustrated as a NAND gate 184 which has an output connected to a set input of an RS flip-flop 185. When either of counters 180 or 181 reach a count of three indicating that a phase error has persisted for three vertical fields, the corresponding one of gates 182 and 184 is enabled.

Count detection logic 33 detects count 11 of counter 30 in accordance with the logic equation:

$$C11 = Q1.Q2.\overline{Q3}.Q4.\overline{Q5}.\overline{Q6}.\overline{Q7}.\overline{Q8}.\overline{Q9}.\overline{Q10} \quad (8)$$

and couples a C11 pulse via a lead 186 to inputs of gates 182 and 184. If either of gates 182 or 184 is enabled at the count of 11, the corresponding one of flip-flops 183 and 185 is set. The output of flip-flop 183 is connected to an input of a NAND gate 187 and via a lead 190 to gate 66 of FIG. 2. When flip-flop 183 is set, the add pulse, illustrated in FIG. 3, is coupled to gates 66 and 187. Similarly, flip-flop 185 has an output connected to an input of a gate 191 and to a lead 192 connected to an input of gate 62 of FIG. 2. When flip-flop 185 is set, a delete pulse, illustrated in FIG. 3, is coupled to gates 62 and 191.

The outputs of gates 187 and 191 are coupled to inputs of a monostable multivibrator 193. Count detection logic 33 detects the count of 12 of counter 30 in accordance with the logic equation:

$$C12 = \overline{Q1}.\overline{Q2}.Q3.Q4.\overline{Q5}.\overline{Q6}.\overline{Q7}.\overline{Q8}.\overline{Q9}.\overline{Q10} \quad (9)$$

and couples a C12 pulse via a lead 194 to inputs of gates 187 and 191. Gate 187 also receives the CP pulses on lead 31, while gate 191 receives the $\overline{CP}$ pulses on lead 61. If flip-flop 183 is set at the count of 12 of counter 30, gate 187 is enabled and the next $\overline{CP}$ pulse causes gate 187 to provide a 0 to trigger multivibrator 193 to provide an add enable output pulse on lead 195. Similarly, if flip-flop 185 is set at the count of 12, the next CP pulse causes gate 191 to provide 0 to multivibrator 193 to provide a delete enable pulse on lead 195. The add enable and delete enable pulses are illustrated in FIG. 3. Lead 195 is coupled to inputs of gates 62 and 66 of FIG. 2. Lead 195 is further connected by capacitor 196 to the reset inputs of flip-flops 183 and 185 to reset the flip-flops on the trailing edge of the add or delete enable pulse.

Referring to FIG. 2, it was noted previously that gate 66 normally provides a 1 output while gate 62 normally provides a 0 output. When it is desired to retard counter 30, a delete pulse on lead 192 and a delete enable pulse on lead 195 cause gate 62 to provide a 1 output to gate 63 thereby suppressing one CP pulse on lead 31 to retard counter 30 by one count. Similarly, an add pulse on lead 190 and an add enable pulse on lead 195 cause gate 66 to provide a 0 output to gate 67 so that the trailing edge of one $\overline{CP}$ pulse is coupled therethrough to counter 30 to add one count and advance the phase of counter 30. Lead 91 from mode control 47 is connected to an input of gates 62 and 66 so that gates 62 and 66 are inhibited in the driven mode. Accordingly, in the driven mode the phase of counter 30 cannot be adjusted so that countdown mode detector 44 must detect seven consecutive actual coincidences without phase correction to detect an in-synchronism condition.

After a phase correction has been made, if a phase error still remains, counters 180 or 181 will count phase errors again for three consecutive fields and another pulse will be added or deleted from counter 30. Phase correction permits countdown mode operation for non-interlaced or non-standard signals which are sufficiently near the 525:1 relationship without requir ing periodic resetting of counter 30 and attendant vertical jitter or other deleterious effects. Furthermore, phase correction allows counter 30 to track a properly interlaced signal even though transmission phase errors may occur due to camera switching or the like without requiring periodic resetting of counter 30.

Those skilled in the art will realize that the use of counts 11 and 12 to trigger the phase error correction is arbitrary. Any counts subsequent to detection of phase errors could be satisfactorily used. Those skilled in the art will also realize that the phase correction circuitry has a ± one count tolerance. Thus, counter 30 may be one count fast or slow. It should be noted, however, that the mode switch gate and the countdown gate also have a ± one count tolerance and will still overlap so that a proper countdown condition will be detected. If a tolerance is not desired, counts 524 and 7 can be used for the slow and fast phase guards, respectively.

Since on weak signals or noisy signals the relative time that vertical sync pulses are detected may vary from one field to the next, phase errors may be detected when they do not actually exist. In order to prevent such false phase errors from periodically causing improper phase correction of counter 30, counters 180 and 181 are periodically reset. The fast phase guard on lead 145 is coupled to an input of a counter illustrated as a two-stage J-K flip-flop counter 200 which provides QT and QU outputs. The QT and QU outputs of counter 200 and the C11 pulse on lead 186 are coupled to inputs of a NAND gate 201 which has an output connected to a set input of an RS flip-flop 202. Thus, every three fields gate 201 sets flip-flop 202. The output of flip-flop 202 is connected to an input of a NAND gate 203.

Count detection logic 33 detects count 400 of counter 30 in accordance with the logic equation:

$$C400 = \overline{Q1}.\overline{Q2}.\overline{Q3}.\overline{Q4}.Q5.\overline{Q6}.\overline{Q7}.Q8.Q9.\overline{Q10} \quad (10)$$

and couples a C400 pulse on a lead 204 to a second input of gate 203. The use of count 400 is arbitrary for this purpose. When flip-flop 202 is set, gate 203 provides a 0 output at the count of 400 by counter 30 to the flip-flops of counters 180, 181, and 200 to reset all of the counters. Accordingly, counter 200 counts vertical fields, and every three fields counters 180, 181, and 200 are reset to prevent error build up. The $\overline{QN}$, $\overline{QP}$, $\overline{QR}$, $\overline{QS}$, $\overline{QT}$, and $\overline{QU}$ outputs from counters 180, 181, and 200 are connected to inputs of a NAND gate 205 which has an output connected to a reset input of a flip-flop 202 so that flip-flop 202 is reset after all of the flip-flops in counters 180, 181, and 200 have been reset.

Accordingly, a vertical synchronizing circuit which possesses numerous advantages over the prior art has been shown and described. The vertical synchronizing circuit permits the use of a countdown mode of operation even though a non-standard composite video signal is received or the synchronizing pulses are not precisely interlaced without requiring periodic resetting of the main counter. Furthermore, the illustrated and described vertical synchronizing circuit provides optimum noise immunity by blocking-out as much noise as possible. Furthermore, two-count comparison gates are used for determining whether to go into the countdown mode of operation so that the countdown mode can be more readily achieved in the presence of weak and/or noisy synchronizing signals. In addition, an auxiliary counter is provided to prevent scan collapse when vertical synchronizing pulses are not present or are not detected to prevent damage to the cathode ray tube being scanned or to the vertical deflection circuit. Those skilled in the art will realize that numerous changes and modifications can be made in addition to those mentioned above. For example, particular pulses with particular timing have been used. Those skilled in the art will realize that other pulses and alternate timing can be used as well.

While there has been shown and described what is at present considered the preferred embodiment of the invention it will be obvious to those skilled in the art that various changes and modifications may be made therein without departing from the invention as defined by the appended claims.

What is claimed is:

1. A vertical synchronizing circuit for providing vertical output pulses in synchronism with vertical synchronizing pulses contained in a composite video signal, said circuit including means for providing pulses synchronized with horizontal synchronizing pulses contained in said composite video signal, counting means connected to said means for providing pulses for counting the pulses provided thereto, and output means connected to said counting means for providing said vertical output pulses, the improvement comprising:

vertical synchronizing pulse gating means for receiving said vertical synchronizing pulses and connected to said output means;

synchronism detecting means connected to said gating means and to said counting means for detecting whether said counting means is in-synchronism or out-of-synchronism with said received vertical synchronizing pulses; and gate enabling means connected to said synchronism detecting means, to said gating means, and to said counting means for enabling said gating means at a predetermined count of said counting means when said synchronism detecting means detects an in-synchronism condition and at a predetermined earlier count when said synchronism detecting means detects an out-of-synchronism condition, and for inhibiting said gating means after a vertical synchronizing pulse is coupled therethrough.

2. A vertical synchronizing circuit as defined in claim 1 wherein said gate enabling means enables said gating means when an out-of-synchronism condition is detected at a count of said counting means predetermined to enable said gating means prior to the receipt of a vertical synchronizing pulse from a non-standard composite video signal.

3. A vertical synchronizing circuit as defined in claim 2 wherein said counting means includes first and second counters each connected to said output means and to said gate enabling means, said gating means being enabled in response to a count of said first counter when an in-synchronism condition is detected and in response to a count of said second counter when an out-of-synchronism condition is detected.

4. A vertical synchronizing circuit as defined in claim 3 wherein said output means is connected to said second counter for resetting said second counter when each of said vertical output pulses is provided.

5. A vertical synchronizing circuit as defined in claim 4 wherein said second counter causes said output means to provide a vertical output pulse at a predetermined count subsequent to the expected receipt of vertical synchronizing pulses from a non-standard composite video signal.

6. A vertical synchronizing circuit as defined in claim 3 wherein said gating means includes a first gate and said gate enabling means includes a bistable circuit connected to said first gate for inhibiting said first gate in a first state and enabling said first gate in a second state, said gate enabling means further includes second and third gates each connected to said synchronism detecting means and to respective ones of said first and second counters for switching said bistable circuit to said second state at one of said predetermined counts, and means connected to said first gate for switching said bistable circuit to said first state after receipt of a signal from said first gate.

7. A vertical synchronizing circuit for providing vertical output pulses in synchronism with vertical synchronizing pulses contained in a composite video signal comprising:
   output means for providing said vertical output pulses;
   means for providing pulses synchronized with horizontal synchronizing pulses contained in said composite video signal;
   a first counter connected to said means for providing pulses for counting the pulses provided thereto and to said output means for providing a pulse thereto when a predetermined number of pulses have been counted;
   a second counter connected to said means for providing pulses for counting the pulses provided thereto and to said output means, said second counter resetting each time said output means provides a vertical output pulse;
   synchronism detecting means connected to said first counter for detecting whether said first counter is in-synchronism or out-of-synchronism with said vertical synchronizing pulses;
   vertical synchronizing pulse gating means connected said output means for coupling said vertical synchronizing pulses thereto and to said synchronism detecting means; and
   gate enabling means connected to said synchronism detecting means, to said first and second counters, and to said gating means for enabling said gating means at a predetermined count of said first counter when said synchronism detecting means detects an in-synchronism condition and at a predetermined earlier count of said second counter when said synchronism detecting means detects an out-of-synchronism condition, and for inhibiting said gating means after a vertical synchronizing pulse is coupled therethrough.

8. A vertical synchronizing circuit as defined in claim 7 wherein said gating means includes a first gate and said gate enabling means includes a bistable circuit connected to said first gate for inhibiting said first gate in a first state and enabling said first gate in a second state, said gate enabling means further includes second and third gates each connected to said synchronism detecting means and to respective ones of said first and second counters for switching said bistable circuit to said second state at one of said predetermined counts, and means connected to said first gate for switching said bistable circuit to said first state after receipt of a signal from said first gate.

9. A vertical synchronizing circuit as defined in claim 7 wherein said gate enabling means enables said gating means when an out-of-synchronism condition is detected at a count of said counting means predetermined to enable said gating means prior to the receipt of a vertical synchronizing pulse from a non-standard composite video signal.

10. A vertical synchronizing circuit as defined in claim 9 wherein said second counter causes said output means to provide a vertical output pulse at a predetermined count subsequent to the expected receipt of vertical synchronizing pulses from a non-standard composite video signal.

* * * * *